United States Patent
Kurahashi et al.

(10) Patent No.: US 7,612,400 B2
(45) Date of Patent: Nov. 3, 2009

(54) MIM DEVICE AND ELECTRONIC APPARATUS

(75) Inventors: Teruo Kurahashi, Kawasaki (JP); Hideharu Shido, Kawasaki (JP); Kenji Ishikawa, Kawasaki (JP); Takeo Nagata, Kawasaki (JP); Yasuyoshi Mishima, Kawasaki (JP); Yukie Sakita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/944,847

(22) Filed: Nov. 26, 2007

(65) Prior Publication Data

US 2008/0121858 A1 May 29, 2008

(51) Int. Cl.
*H01L 27/108* (2006.01)

(52) U.S. Cl. .................. 257/306; 257/298; 257/312; 257/516; 257/532; 438/210; 438/239; 438/250; 438/253; 438/397

(58) Field of Classification Search .......... 257/296, 257/298, 301, 303, 306, 312, 516, 532, E27.034, 257/E27.048, E27.071, E27.092; 438/210, 438/239, 243, 244, 250, 253, 386, 387, 393, 438/397, FOR. 220, FOR. 430
See application file for complete search history.

(56) References Cited

U.S. PATENT DOCUMENTS

2002/0014644 A1* 2/2002 Van Buskirk et al. ....... 257/295
2002/0022334 A1* 2/2002 Yang et al. .................. 438/396
2005/0145916 A1 7/2005 Park et al.
2006/0002174 A1* 1/2006 Hosoi et al. ................. 365/148
2006/0017115 A1* 1/2006 Tu et al. ...................... 257/371
2006/0273367 A1 12/2006 Wang
2008/0137261 A1* 6/2008 Naito et al. ............... 361/301.1

FOREIGN PATENT DOCUMENTS

| JP | 2003-218211 A | 7/2003 |
| KR | 10-2005-0059540 | 6/2005 |
| KR | 10-2006-0120246 | 11/2006 |

OTHER PUBLICATIONS

Yuichi Matsui et al; "A 500° C fabrication process for MIM capacitors-based on a Ta2O5/Nb2O5 bilayer with high permittivity-for DRAM and SoC applications," SSDM 2004; pp. 760-761.
Hyunjun Sim et al; "Excellent Resistance Switching Characteristics of Pt/SrTiO3 Schottky Junction for Multi-bit Nonvolatile Memory Application," IEEE Electron Device Lett. 26; 2005; pp. 292.
Official Action mailed by the Korean Patent Office on Jul. 7, 2009, in connection with corresponding KR patent application serial No. 10-2007-0121853.

* cited by examiner

*Primary Examiner*—N Drew Richards
*Assistant Examiner*—Joannie A Garcia
(74) *Attorney, Agent, or Firm*—Fujitsu Patent Center (57) ABSTRACT

An MIM device includes a lower electrode of a metal nitride film, a hysteresis film of an oxide film containing Nb formed on the lower electrode, and an upper electrode of a metal nitride film formed on the hysteresis film.

20 Claims, 9 Drawing Sheets

MIM DEVICE AND ELECTRONIC APPARATUS

CROSS-REFERENCE TO RELATED APPLICATION

The present application is based on Japanese priority application No. 2006-322457 filed on Nov. 29, 2006, the entire contents of which are hereby incorporated by reference.

TECHNICAL FIELD

The present invention generally relates to electron devices and more particularly to an MIM device.

BACKGROUND OF THE INVENTION

With progress in the miniaturization technology, commercialization of ultrafine semiconductor devices having a gate length of several nanometers is now in sight.

On the other hand, with such ultrafine semiconductor devices, production cost is increasing sharply, and tremendous difficulties are expected with regard to further miniaturization thereof, not only from the viewpoint of production technology but also from the viewpoint of production cost.

Meanwhile, it is known conventionally, in MIM (metal-insulator-metal) capacitors, especially an MOM (metal-oxide-metal) capacitor that uses an oxide film for the capacitor insulation film, that the capacitor insulation film shows hysteresis even when the capacitor insulation film is formed of a non-ferroelectric substance, such as a NiO film, a $Fe_2O_3$ film or a CuO film, when a voltage exceeding a certain forming voltage is applied. Thus, investigations are in progress for constructing ultra minute memories and switches by using the hysteresis characteristic thus discovered.

SUMMARY OF THE INVENTION

The present invention is directed to various embodiments of an MIM device, electronic apparatus, and a method for fabricating an electronic apparatus having an oxide film containing Nb for the hysteresis film, and a metal nitride film for the upper and lower electrodes.

DETAILED DESCRIPTION OF THE PREFERRED EMBODIMENTS

Figure 1A:
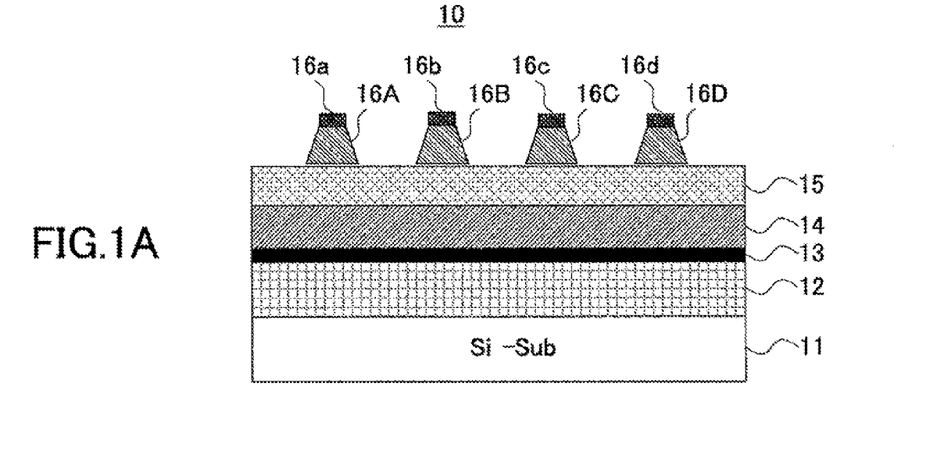
FIGS. 1A and 1B are diagrams showing the construction of an MIM device.
Figure 1B:
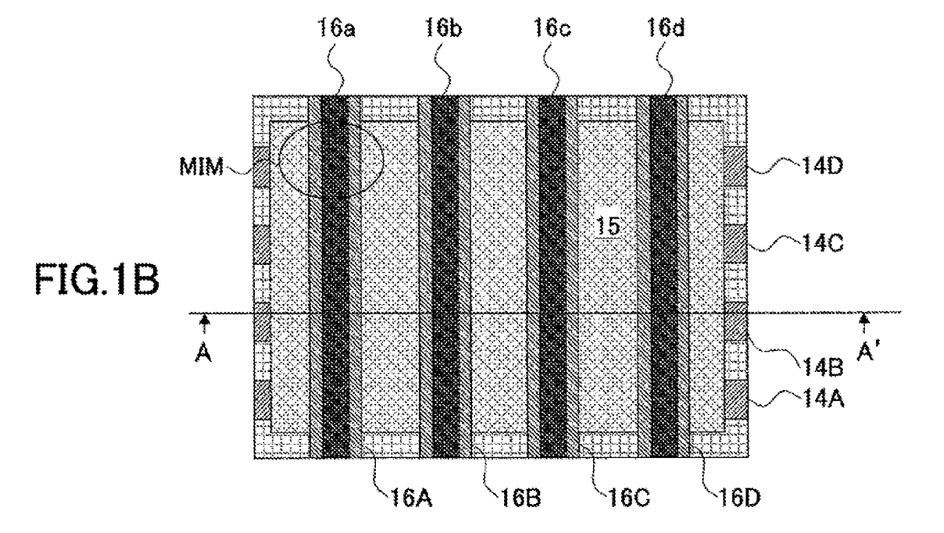

FIGS. 1A and 1B show the construction of an electronic apparatus 10 that includes an MIM device of a Pt/NiO/Pt structure, wherein it should be noted that FIG. 1B shows a plan view of the electronic apparatus 10 while FIG. 1A shows the cross-sectional diagram taken along a line A-A' in FIG. 1B.

Referring to FIGS. 1A and 1B, there is formed a Pt film 14 constituting lower electrode patterns 14A-14D on a silicon substrate 11 via a silicon oxide film 12 of the thickness of 100 nm with an intervening Ti adhesion layer 13, and an NiO film 15 is formed on the silicon oxide film 12 as the capacitor insulation film, such that the NiO film 15 covers the lower electrode patterns 14A-14D.

Further, on the NiO film 15, there are formed upper electrodes 16A-16D each formed of a Pt film, such that the upper electrodes 16A-16D cross the lower electrodes 13A-13D when viewed in a plan view. In the illustrated example, hard mask patterns 16a-16d, each formed of a Ta film, are formed respectively on the upper electrodes 16A-16D.

Figure 2:
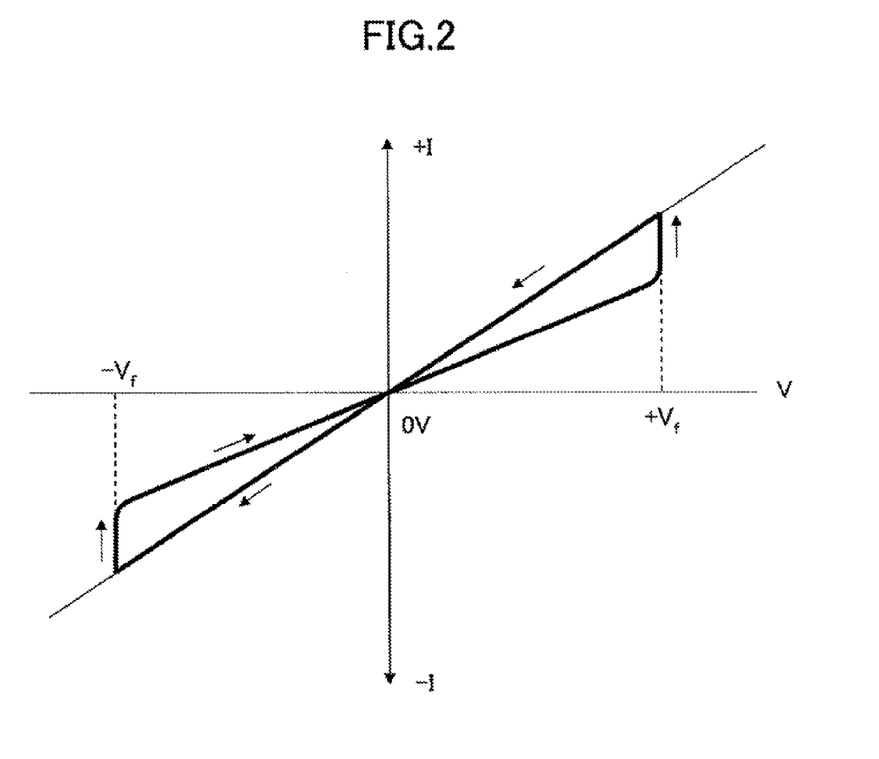
FIG. 2 is a diagram showing an example of hysteresis that is caused in the MIM device of FIGS. 1A and 1B.

With such a construction, there is formed an MIM device in correspondence to each of intersection of the lower electrode patterns 14A-14A and the upper electrode patterns 16A-16D as circled in FIG. 1B, wherein the MIM device has a hysteresis in the I-V characteristics thereof as shown schematically in FIG. 2.

Referring to FIG. 2, it can be seen that the current I flowing through the MIM device increases with applied voltage V when the applied voltage V is increased from 0V in the positive polarity direction. Further, it can be seen that, when the applied voltage has reached a predetermined voltage Vf, there occurs a sudden increase of the electric current (sudden drop of resistance). Further, it can be seen that the electric current changes along a loop and returns to the original value when the applied voltage is decreased thereafter.

Further, in the case the applied voltage V is increased from 0V in the negative polarity direction, a similar loop appears in symmetry to the origin where the applied voltage V is 0V, and thus, the current I drops suddenly (increase of resistance) when the applied voltage V has reached a predetermined voltage –Vf.

Thus, each MIM device of the FIGS. 1A and 1B can take two states: a high resistance state characterized by high electric resistance, and low resistance state characterized by low electric resistance.

Figure 3:
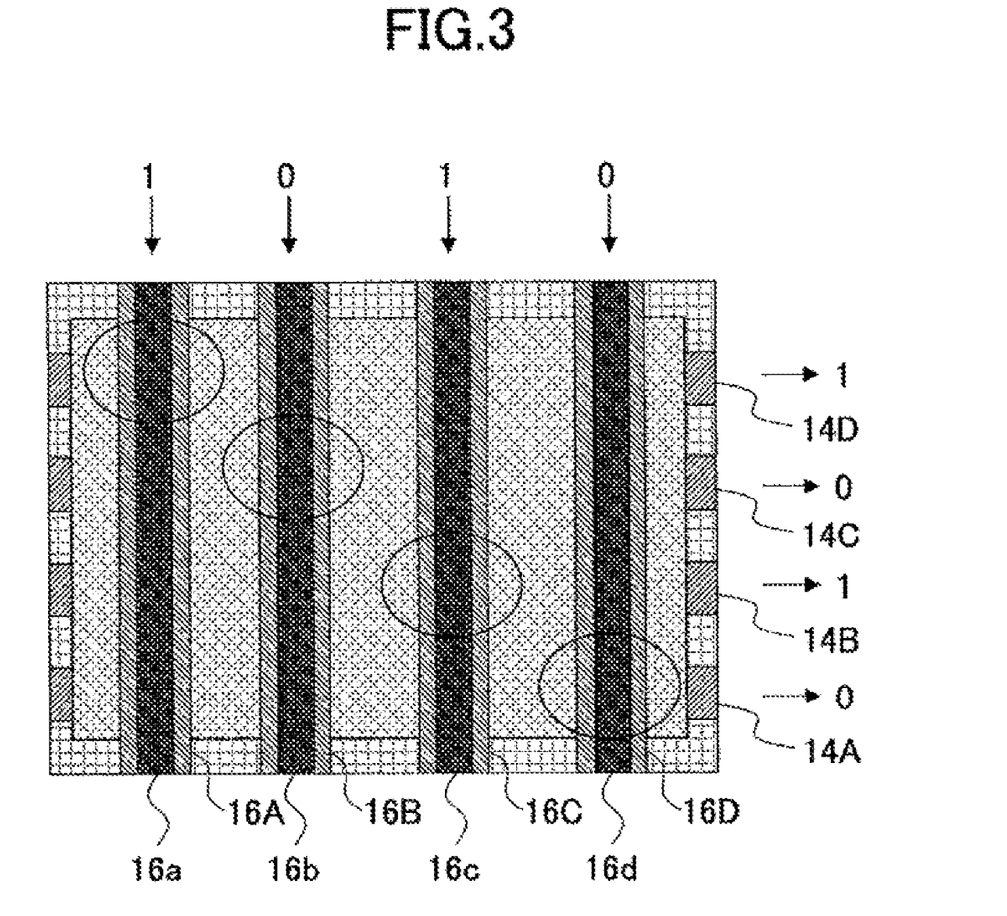
FIG. 3 is a diagram showing an example of the electronic apparatus formed by an MIM device of FIGS. 1A and 1B.

While the mechanism of appearance of the hysteresis loop of FIG. 2 is not understood clearly, the hysteresis loop of FIG. 2 nevertheless implies that it is possible to program the MIM device of FIG. 1 by applying a voltage larger than the voltage Vf and that it is possible to control the switching operation in an electronic apparatus in which such MIM devices are formed in the form of matrix, for example, as shown in FIG. 3. Also, the hysteresis loop of FIG. 2 implies that such an electronic apparatus can perform various logic operations.

In the example of FIG. 3, it should be noted that only the MIM device represented with circle is in the low resistance state.

On the other hand, with the electronic apparatus shown in FIGS. 1A and 1B, there is a problem of high cost of the apparatus because of the fact that the lower electrodes 14A-14D and the upper electrodes 16A-16D are all formed of Pt. With the electronic apparatus of such a matrix construction, it should be noted that there is a need that each of the lower electrode patterns 14A-14D and upper electrode patterns 16A-16D extends from one end of to the opposite end of the electronic apparatus continuously, and because of this, a large amount of Pt is needed as compared with other devices such as an FeRAM, in which the Pt film is used only for the capacitor.

Further, in the case of constructing the electronic apparatus of FIGS. 1A and 1B, there is a need of patterning a Pt film, while Pt is a material difficult to be etched by a dry etching process, and thus, it is necessary to use a hard mask pattern and form a thick resist pattern on the hard mask pattern for patterning such a Pt film with a dry etching process.

With the example of FIGS. 1A and 1B, in which a Pt film having a thickness of 50 nm is patterned for forming the upper electrodes 16A-16D, a Ta film having a thickness of 20 nm is used for the hard mask and a resist pattern is formed thereon with the thickness of 80 nm.

Thus, with the electronic apparatus 10 that uses such MIM devices, a long process time is needed for patterning the Pt film, and there has been a problem also in the aspect of manufacturing efficiency.

Further, with the electronic apparatus of FIGS. 1A and 1B, in which the magnitude of resistance change of the MIM device between the high resistance state and the low resistance state is small, there has been a problem that a large forming voltage is needed, and a high voltage is needed also for programming. Further, a large voltage pulse is needed for detecting the resistance state at the time of the programming and reading. Thus, there has been a problem that the MIM device consumes a large electric power.

Figure 4A:
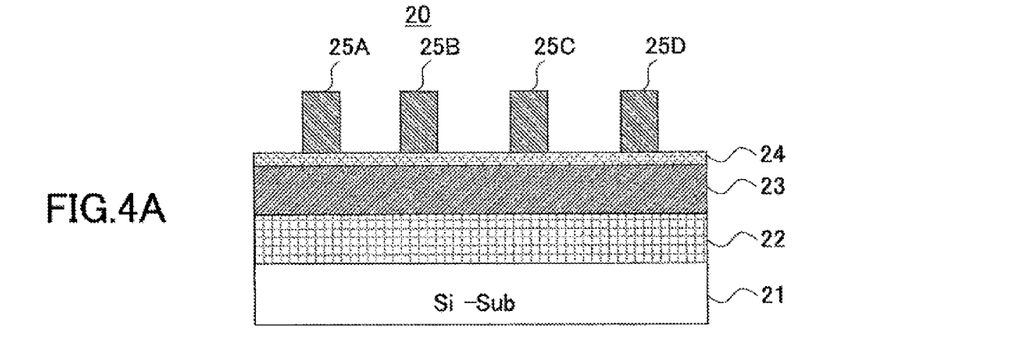
FIGS. 4A-4C are diagrams showing the construction of an electronic apparatus according to a first embodiment of the present invention.
Figure 4B:
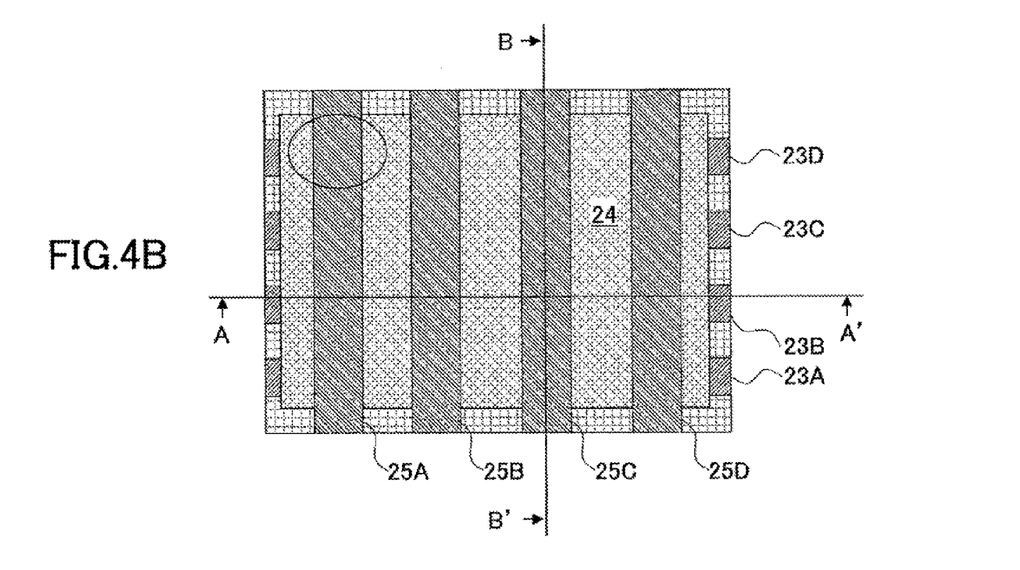
Figure 4C:
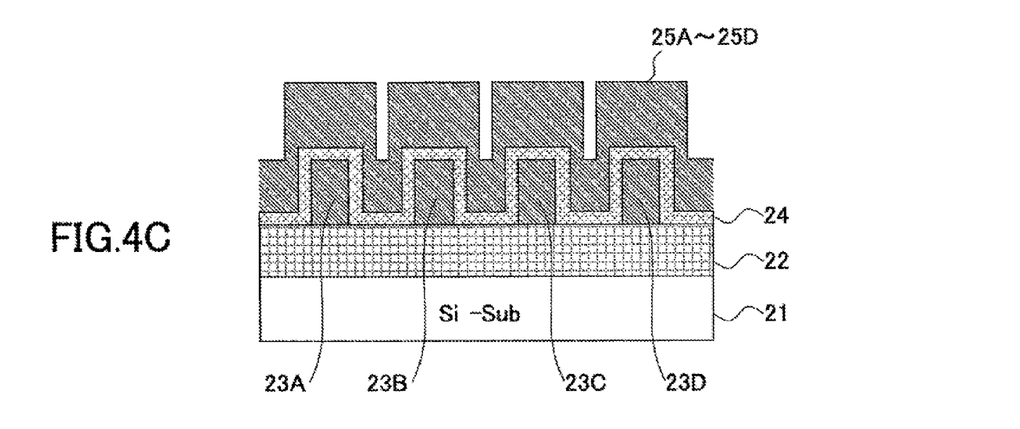

FIGS. 4A-4C shows the construction of an electronic apparatus 20 according to a first embodiment of the present invention. wherein FIG. 4B shows the plan view of the electronic apparatus 20, FIG. 4A shows the cross-sectional view taken along a line A-A' of the plan view of FIG. 4B, while FIG. 4C shows the cross-sectional view taken along the line B-B' in FIG. 4B.

Referring to FIGS. 4A-4C, the electronic apparatus 20 is formed on a silicon substrate 21 via a silicon oxide film 22 having a thickness of 100 nm, for example, wherein lower electrode patterns 23A-23D of a molybdenum nitride (MoN) film of the thickness of 90 nm, for example, are formed on the silicon oxide film 22 parallel with each other repeatedly with a pitch of 50 nm wherein each of the patterns 23A-23D are formed to extend in the lateral direction of the drawing with a width of 50 nm.

Further, there is formed a hysteresis film 24 of $Nb_2O_5$ on the silicon oxide film 22 with a thickness of 1 nm or more but not exceeding 50 nm, such as 25 nm, so as to cover the lower electrode patterns 23A-23D. Further, on the hysteresis film 24, there are formed upper electrode patterns 25A-25D of MoN of the thickness of 90 nm, for example, such that the patterns 25A-25D are repeated in the vertical direction of the drawing with a width of 50 nm and a pitch of 50 nm. Incidentally, it should be noted that the film thickness, the pattern width and the pitch of repetition of the lower electrode patterns 23A-23D and the upper electrode patterns 25A-25D are by no means limited to those noted above.

While molybdenum nitride (MoN) generally has a non-stoichiometric composition $MoN_x$, the present invention uses molybdenum nitride of near-stoichiometric composition, in other words, the molybdenum nitride with the compositional parameter x close to 1, for the lower electrode patterns 23A-23D and the upper electrode patterns 25A-25D in order to suppress oxidation of Mo in the lower electrode patterns 23A-23D and the upper electrode patterns 25A-25D.

Figure 5A:
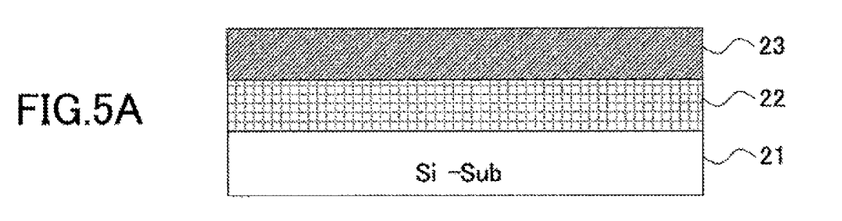
FIGS. 5A-5C are diagrams showing the fabrication process of the electronic apparatus of FIGS. 4A-4C.
Figure 5B:
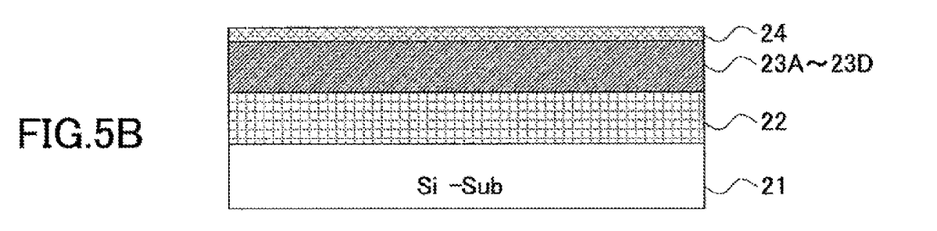
Figure 5C:
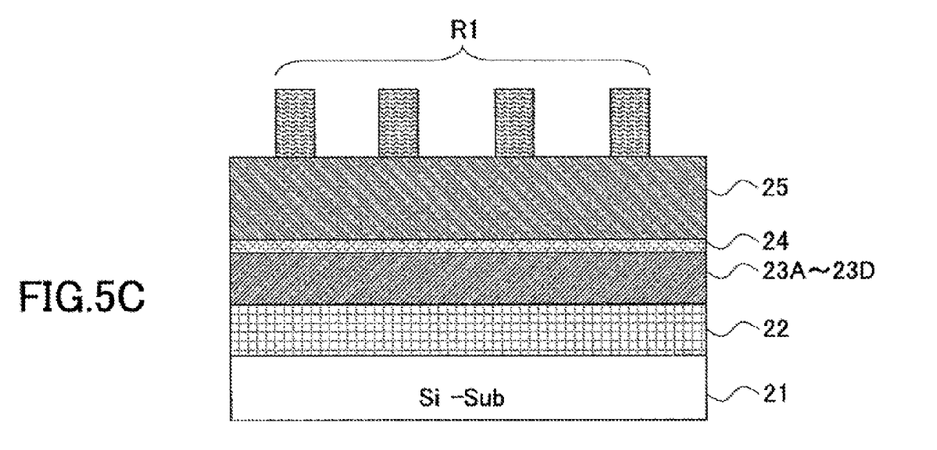

FIGS. 5A-5C show the fabrication process of the electronic apparatus 20 of FIGS. 4A-4C.

Referring to FIG. 5A, a MoN film is formed on the silicon oxide film 22 that covers the silicon substrate 21 at a room temperature typically with a reactive sputtering process, followed by a patterning process conducted by resist process, and with this, the lower electrode patterns 23A-23D are formed.

Next, with the step of FIG. 5B, the $Nb_2O_5$ hysteresis film 24 is formed on the silicon oxide film 22 by a sputtering process at room temperature so as to cover the MoN lower electrode patterns 23A-23D.

Next, in the step of FIG. 5C, a MoN film 25 is formed with a thickness of 90 nm, for example, by a sputtering process subsequent to formation of the hysteresis film 24, and the upper electrode patterns 25A-25D are formed by further patterning the same by a dry etching while using a resist pattern R1 for the mask.

In the illustrated example, the dry etching process of FIG. 5C is conducted in Ar gas plasma by an RIE process that uses a $Cl_2$ gas and an $O_2$ gas as the etching gas. In this case, it is possible to secure etching selectivity of about 40 times with regard to the $Nb_2O_5$ film, and the hysteresis film 24 functions as an effective etching stopper film.

Thus, it is possible to carry out the patterning process easily without forming the hard mask films 16a-16d as in the case of the related art of FIGS. 1A-1B when the resist pattern R1 is formed with a film thickness of 400 nm, for example, and it becomes possible to carry out the manufacturing of the electronic apparatus 20 efficiently and with low cost, and without causing overetching in the hysteresis film 24.

Referring to FIGS. 4A-4C again, it can be seen that there is formed an MIM device of the $MoN/Nb_2O_5/MoN$ structure in each intersection of the lower electrode patterns 23A-23D and the upper electrode patterns 25A-25D when viewed in the perpendicular direction to the substrate 21 as circled in the plan view of FIG. 4B.

Figure 6:
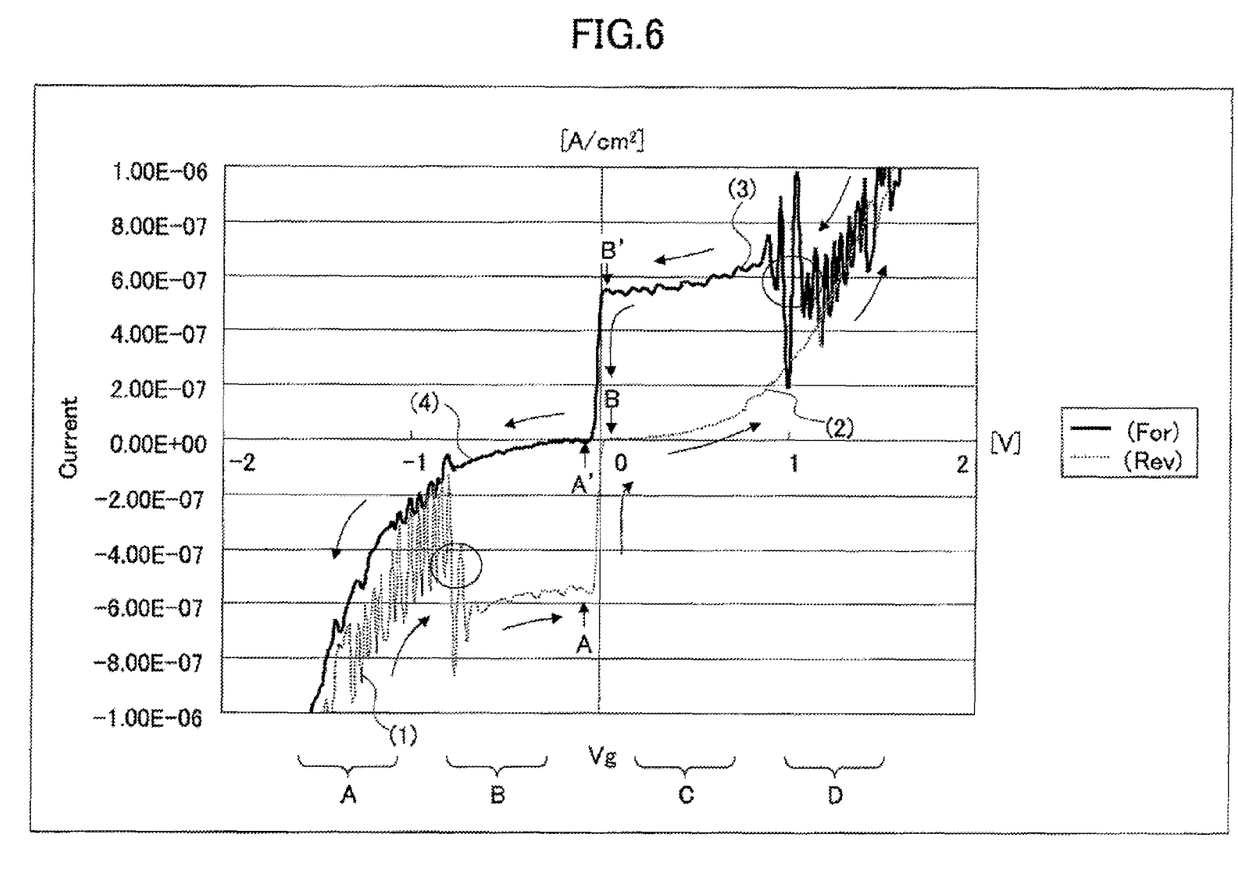
FIG. 6 is a diagram showing the hysteresis characteristic of the MIM device that constitutes the electronic apparatus of FIGS. 5A-5C.

FIG. 6 is a diagram showing the voltage-current characteristic of a single MIM device thus obtained, wherein it should be noted that the measurement of FIG. 6 is conducted for the MIM device having the hysteresis film 24 of the thickness of 22.5 nm and the diameter of 100 μm. In FIG. 6, the horizontal axis represents the voltage applied between the upper electrode and the lower electrode, while the vertical axis represents the current flowing through the MIM device.

In FIG. 6, the upper part represents the current of positive polarity, while the lower part represents the current of negative polarity. Thus, in the upper half, the magnitude of the current increases in the upward direction, while in the lower half of the diagram, the magnitude of the current increases in the downward direction. The experiment of FIG. 6 is conducted by measuring the electric current that flows through the MIM device by changing the applied voltage from −2.5V to +2.5V and then changing from +2.5V to −2.5V.

Referring to FIG. 6, it can be seen that the magnitude of the current decreases along a first curve (1) when the applied voltage is changed gradually from −2.5V to 0V and that the magnitude of the current increases along a second curve (2) when the applied voltage is changed gradually from 0V to +2.5V.

Further, when the applied voltage is changed gradually from +2.5V to 0V, the magnitude of the current decreases along a third curve (3), while when the applied voltage is changed gradually from 0V to −2.5V, the magnitude of the current increases along a fourth curve (4).

Thereby, it should be noted that the curve (1) and the curve (4) coincides with each other at a first forming voltage located in the negative voltage region beyond the illustrated range of the drawing. When the magnitude of the applied voltage becomes smaller than the foregoing forming voltage, the current value on the curve (1) becomes larger than the current value on the curve (4).

Similarly, it should be noted that the curve (2) and the curve (3) coincides with each other at a second forming voltage located in the positive voltage region beyond the illustrated range of the drawing. When the magnitude of the applied voltage becomes smaller than the foregoing forming voltage, the current value on the curve (3) becomes larger than the current value on the curve (2).

Because the curve (1) continues to the curve (2) and the curve (3) continues to the curve (4), the curves (1)-(4) form a hysteresis loop.

In the illustrated example, the first forming voltage appears at −2.5V and the second forming voltage appears at +2.5V.

In FIG. 6, it should be noted that the slope of the curves (1)-(4) represents the resistance of the MIM device. Thus, the curve (1), showing a sharp increase of the slope at a voltage A near 0V when the magnitude of the applied voltage is decreased toward 0V in the negative voltage region, means that there occurs a stepwise decrease of resistance of the MIM device at this voltage A.

Further, the curve (2) shows a sharp decrease of the slope when the applied voltage has been changed beyond 0V and reached a positive voltage B near 0V, while this means that there occurs a stepwise decrease of resistance of the MIM device at this voltage B.

Similarly, the curve (3) shows a sharp increase of the slope when the applied voltage has been decreased in the positive polarity range and reached a voltage B' near the voltage B, while this means that there occurs a stepwise decrease of resistance of the MIM device at this voltage B'.

Further, the curve (4) shows a sharp decrease of the slope when the applied voltage has been changed beyond 0V and reached a negative voltage A' near the voltage A, while this means that there occurs a stepwise increase of resistance of the MIM device at this voltage A'.

The resistance change of the MIM device between the voltages A and B or between the voltages A' and B' reaches as much as 500 times, while this indicates that the MIM device can take clear bistable states in these voltage regions.

Thus, in the case the electronic apparatus 20 of FIGS. 4A-4C is formed by using the MIM device of the present embodiment, it becomes possible to cause the electronic apparatus 20 to perform various logic operations including AND logic, OR logic and their combinations, by appropriately programming the individual MIM devices.

Thereby, because the first and second forming voltages take a small value of 3V or less with the MIM device of the present embodiment, it should be noted that the programming or writing can be made with small voltage.

Further, because the foregoing bistable state appears at the applied voltage near 0V, it is possible to operate the MIM device with small driving voltage, and the electric power consumption of the electronic apparatus 20 is reduced.

It is interesting to note that, with the voltage-current characteristic of FIG. 6, the value of the current increases and decreases violently at first in the voltage region A when the magnitude of the applied voltage is reduced gradually from the first forming voltage. In this voltage region A, the current through the MIM device repeats increase and decrease with the amplitude much larger than the amplitude in the voltage region B of smaller voltage value. Similarly, in the case the magnitude of the applied voltage is decreased gradually from the second forming voltage, there appears a violent increase and decrease of the electric current through the MIM device in the voltage region D at the higher voltage side, wherein the current through the MIM device repeats increase and decrease with the amplitude much larger than in the region C of smaller voltage including 0V.

While this violent increase and decrease of the current in the voltage regions A and D looks irregular at a first glance, it was confirmed that this fluctuation of current is reproduced when the measurement is repeated, and thus, it is believed that this fluctuation of current reflects some reproducible phenomenon that takes place in the MIM device and forming the cause of the resistance change noted before.

Further, with FIG. 6, it can be seen that there is caused a stepwise increase of the current as circled in FIG. 6 at the transition region from the voltage region A to the voltage region B. A similar stepwise increase of current is seen also in the transition region from the voltage region D to the voltage region C as showing in FIG. 6.

Figure 7:
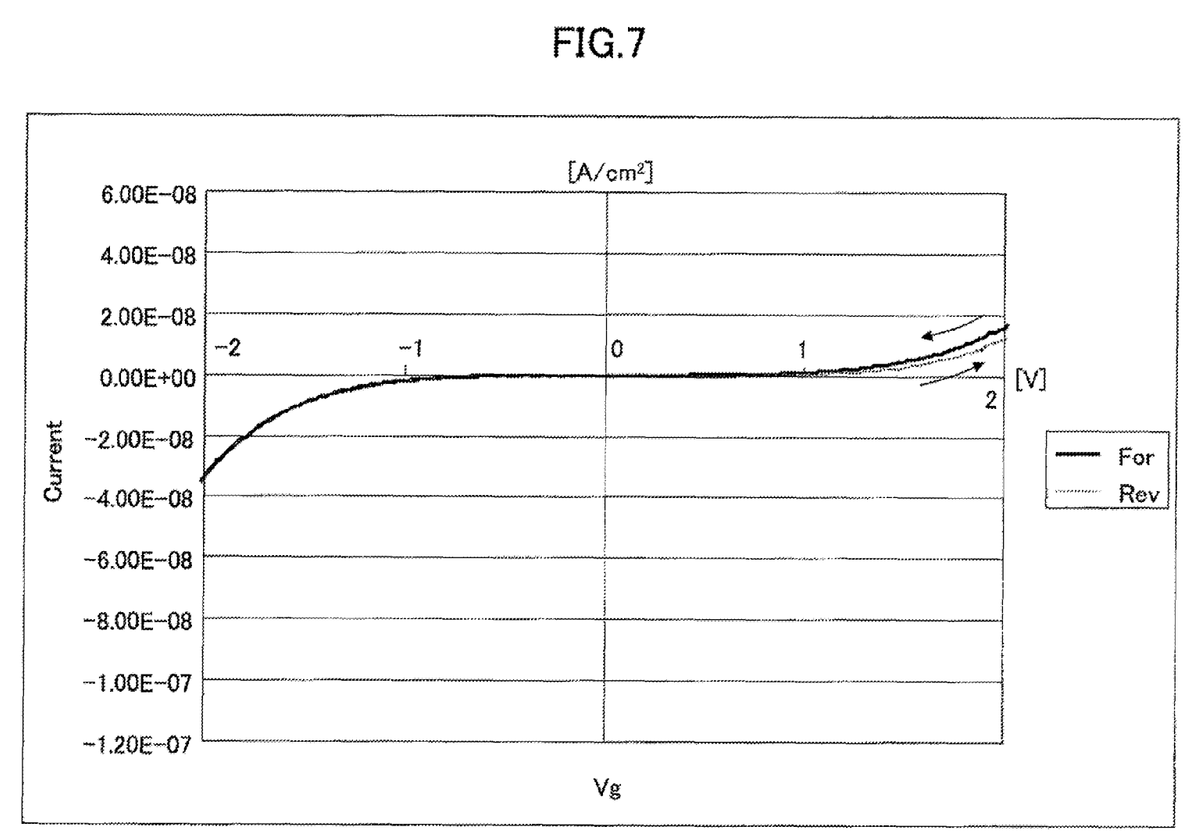
FIG. 7 is a diagram showing the hysteresis characteristic according to a comparative example of the present invention.

It should be noted that the hysteresis of FIG. 6 pertinent to the MIM device of the present invention appears in the case when the hysteresis film 24 has the film thickness of 50 nm or less. Thus, when the film thickness of the hysteresis film 24 is set to 60 nm in the same MIM device, such hysteresis loop disappears as represented in FIG. 7.

Thus, the present invention limits the thickness of the hysteresis film 24 to be 50 nm or less. When the thickness of the hysteresis film 24 becomes less than 1 nm, there occurs increase of the leakage current, while this leads to vanishing of the hysteresis loop. Thus, the hysteresis film 24 should have a film thickness of at least 1 nm.

Figure 8:
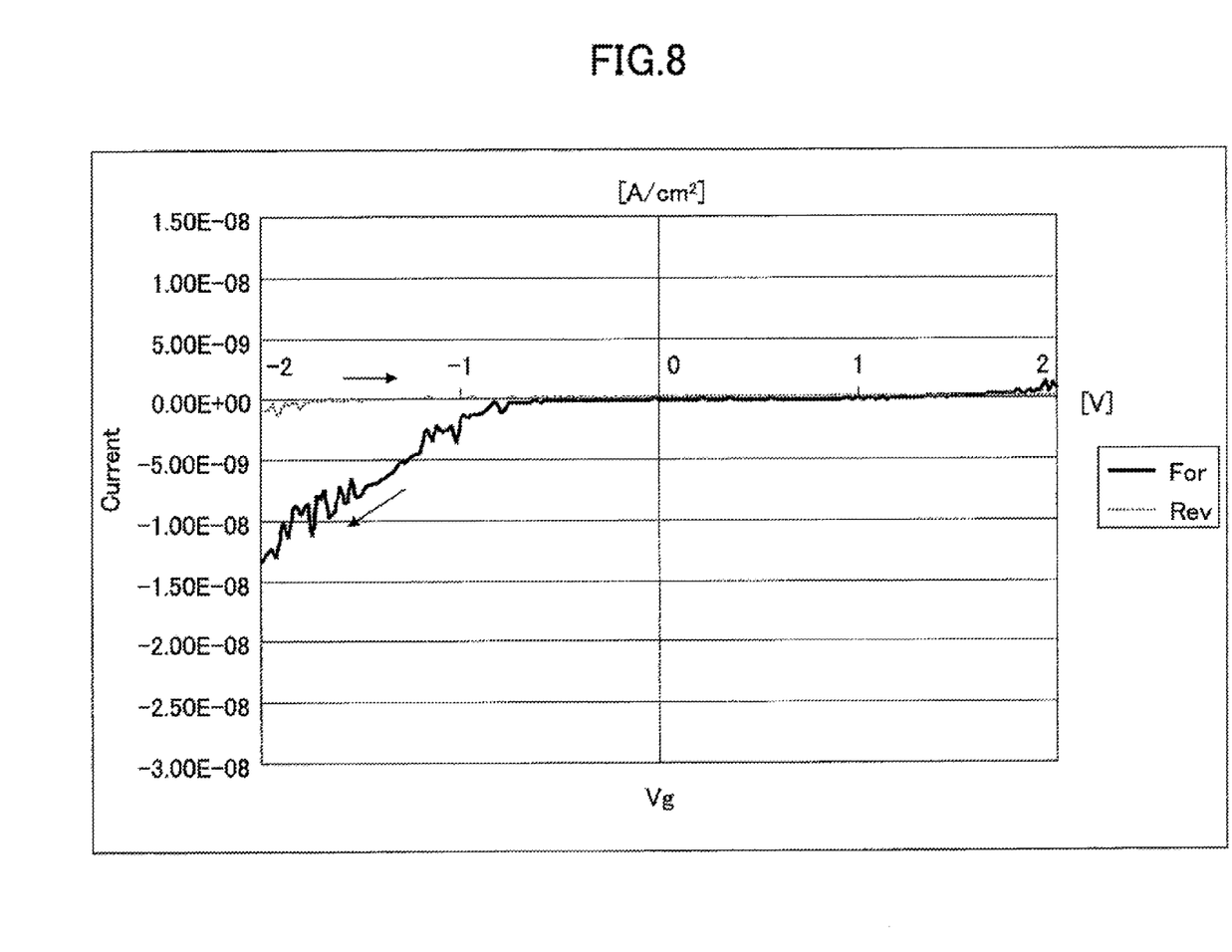
FIG. 8 is another diagram showing the hysteresis characteristic according to the comparative example of the present invention.

Further, FIG. 8 shows the voltage-current characteristics of an MIM device according to a comparative example of the present invention, wherein the MIM device of FIG. 8 has a construction of sandwiching a hysteresis film of NiO between the upper and lower electrodes of MoN.

Figure 9:
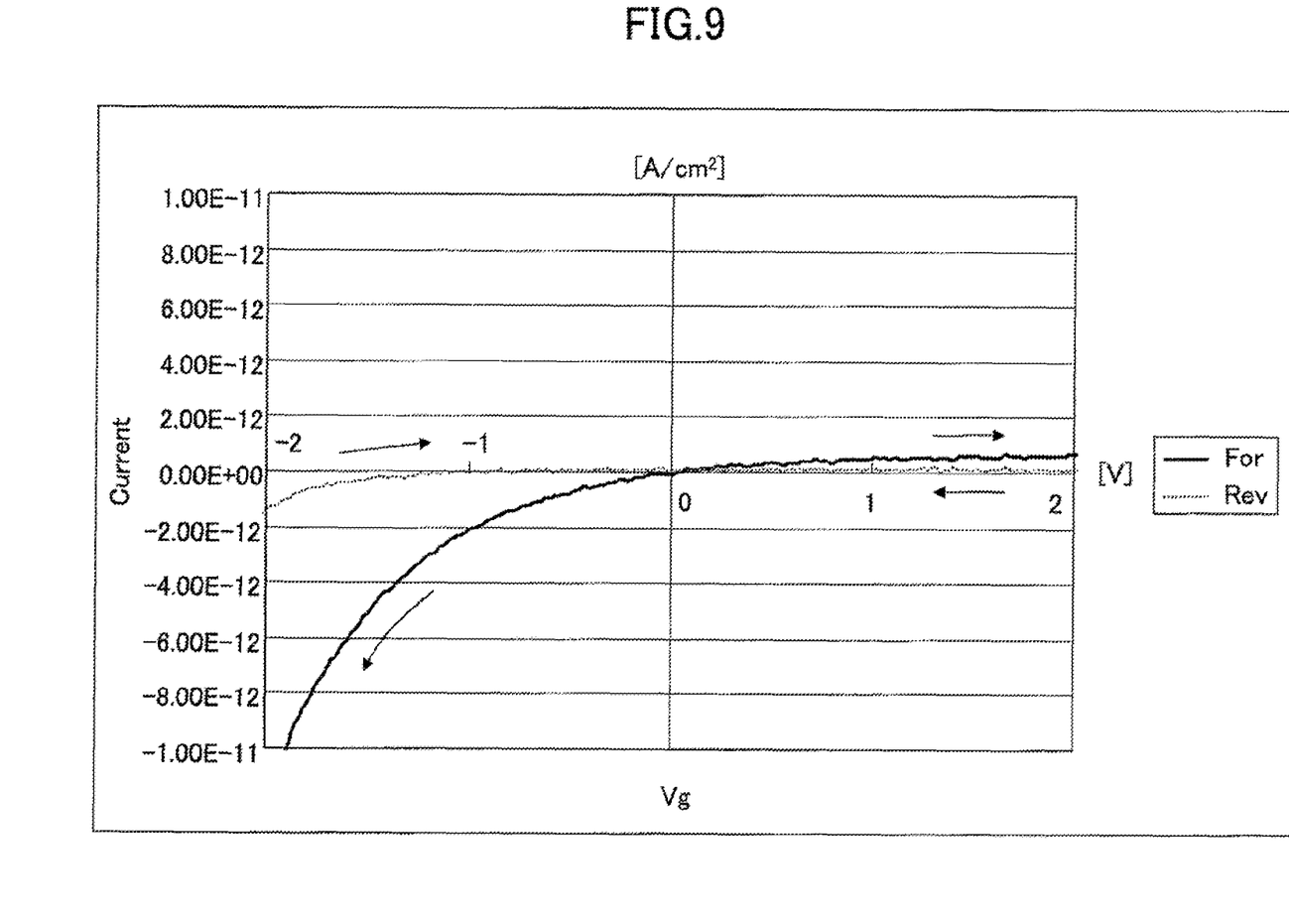
FIG. 9 is a further diagram showing the hysteresis characteristic of the comparative example of the present invention.

Referring to FIG. 9, it can be seen that no hysteresis loop suitable for the programmable MIM device explained with reference to FIG. 6 is obtained when the hysteresis film is not an oxide film containing Nb, even when MoN is used for the upper and lower electrodes.

Further, FIG. 9 shows the voltage-current characteristic of the MIM device according to another comparative example of the present invention, wherein the MIM device of FIG. 9 has a construction of sandwiching a hysteresis film of $Nb_2O_5$ by the upper and lower electrodes of Pt.

Referring to FIG. 9, no hysteresis loop suitable for the programmable MIM device of FIG. 6 is obtained also with this comparative example.

While the present invention has been explained for the case of using MoN for the upper and lower electrode patterns, the present invention is not limited to such a particular electrode patterns and it is also possible to use other conductive metal nitride films such as TaN, WN, HfN, TiN, and the like.

While present invention has been explained heretofore with regard to preferable embodiments, the present invention is by no means limited to such specific embodiments but various variations and modifications may be made without departing from the scope of the present invention as set forth in claims below.

What is claimed is:

1. An MIM device, comprising:
   a lower electrode of a metal nitride film;
   a hysteresis film of an oxide film containing Nb formed on said lower electrode; and
   an upper electrode of a metal nitride film formed on said hysteresis film, wherein said MIM device has a hysteresis characteristic in which:
a current flowing through said MIM device decreases a magnitude thereof along a first curve when a magnitude of a voltage applied between said upper and lower electrodes is decreased from a first forming voltage of a negative polarity;
said magnitude of said current increases along a second curve when said magnitude of said voltage is increased subsequently to a second forming voltage of positive polarity in a positive polarity direction beyond 0V;
said magnitude of said current decreases along a third curve when said magnitude of said voltage is decreased from said second forming voltage to 0V, said third curve providing a larger current magnitude than said second curve; and
said magnitude of said current increases along a fourth curve when said magnitude of said voltage is increased subsequently to said first forming voltage beyond 0V, said fourth curve providing a smaller current magnitude than said first curve.

2. The MIM device as claimed in claim 1, wherein said upper electrode and lower electrodes are formed of a common material selected from the group including MoN, TaN, WN, HfN and TiN.

3. The MIM device as claimed in claim 1, wherein said oxide film containing Nb contains $Nb_2O_5$.

4. The MIM device as claimed in claim 1, wherein said upper electrode is formed of a material selectively etched with regard to a material constituting said hysteresis film.

5. The MIM device as claimed in claim 1, wherein said oxide film containing Nb has a thickness of 1 mm or more but not exceeding 50 nm.

6. The MIM device as claimed in claim 1, wherein
said MIM device further decreases a resistance thereof stepwise in a voltage range near 0V and increases said resistance stepwise when said voltage range near 0V has been exceeded in any of the case of changing said voltage from a negative polarity side to a positive polarity side and the case of changing said voltage from said positive polarity side to said negative polarity side.

7. The MIM device as claimed in claim 6, wherein said stepwise decrease and increase of resistance is caused with a magnitude of 500 times or more in terms of a resistance value.

8. The MIM device as claimed in claim 1, wherein said current repeats increase and decrease with a first amplitude in a first voltage region and with a second amplitude in a second voltage region of smaller voltage magnitude than said first voltage range including 0V when said voltage is changed from said first forming voltage to 0V along said first curve, said first amplitude being larger than said second amplitude,
said current repeats increase and decrease with a third amplitude in a third voltage region and with a fourth amplitude in a fourth voltage region of smaller voltage magnitude than said third voltage range including 0V when said voltage is changed from said second forming voltage to 0V along said third curve, said third amplitude being larger than said fourth amplitude.

9. The MIM device as claimed in claim 8, wherein said MIM device decreases a resistance thereof when said voltage is changed from said first voltage region to said second voltage region, said MIM device increases said resistance when said voltage is changed from said third voltage region to said fourth voltage region.

10. An electronic apparatus, comprising:
a substrate;
a plurality of lower electrode patterns formed in parallel with each other on said substrate, each of said lower electrode patterns comprising a metal nitride;
a hysteresis film of an oxide containing Nb formed on said substrate so as to cover said plurality of lower electrode patterns; and
a plurality of upper electrode patterns each formed of a metal nitride on said hysteresis film so as to cross said plurality of lower electrode patterns when viewed in a direction perpendicular to said substrate,
each of said lower electrode patterns, said hysteresis film and each of said upper electrode pattern forming a plurality of MIM devices,
wherein each of said MIM devices has a hysteresis characteristic in which:
a current flowing through said MIM device decreases a magnitude thereof along a first curve when a magnitude of a voltage applied between said upper and lower electrodes is decreased from a first forming voltage of a negative polarity;
said magnitude of said current increases along a second curve when said magnitude of said voltage is increased subsequently to a second forming voltage of positive polarity in a positive polarity direction beyond 0V;
said magnitude of said current decreases along a third curve when said magnitude of said voltage is decreased from said second forming voltage to 0V, said third curve providing a larger current magnitude than said second curve; and
said magnitude of said current increases along a fourth curve when said magnitude of said voltage is increased subsequently to said first forming voltage beyond 0V, said fourth curve providing a smaller current magnitude than said first curve.

11. The MIM device as claimed in claim 10, wherein said upper electrode patterns and lower electrode patterns are formed of a common material containing any of MoN, TaN, WN, HfN and TiN.

12. The MIM device as claimed in claim 10, wherein said oxide film containing Nb contains $Nb_2O_5$.

13. The MIM device as claimed in claim 10, wherein said upper electrode patterns are formed of a material selectively etched with regard to a material constituting said hysteresis film.

14. The MIM device as claimed in claim 10, wherein said oxide film containing Nb has a thickness of 1 nm or more but not exceeding 50 nm.

15. A method for fabricating an electronic apparatus, comprising:
forming a first metal nitride film on a substrate;
forming a plurality of lower electrode patterns each extending in a first direction by patterning said first metal nitride film;
forming an oxide film containing Nb as a hysteresis film so as to cover said plurality of lower electrode patterns;
forming a second metal nitride film on said hysteresis film; and
forming a plurality of upper electrode patterns each extending in a second direction different from said first direction by patterning said second metal nitride film,
each of said lower electrode patterns, said hysteresis film and each of said upper electrode patterns forming a plurality of MIM devices,
each of said MIM device having a hysteresis characteristic in which:
a current flowing through each of said MIM devices decreases a magnitude thereof along a first curve when a magnitude of a voltage applied between said upper and lower electrodes is decreased from a first forming voltage of a negative polarity;

said magnitude of said current increases along a second curve when said magnitude of said voltage is increased subsequently to a second forming voltage of positive polarity in a positive polarity direction beyond 0V;

said magnitude of said current decreases along a third curve when said magnitude of said voltage is decreased from said second forming voltage to 0V, said third curve providing a larger current magnitude than said second curve; and said magnitude of said current increases along a fourth curve when said magnitude of said voltage is increased subsequently to said first forming voltage beyond 0V, said fourth curve providing a smaller current magnitude than said first curve.

16. The method as claimed in claim 15, wherein said hysteresis film is formed by a sputtering process.

17. The method as claimed in claim 15, wherein said hysteresis film is formed at a room temperature.

18. The method as claimed in claim 15, wherein said hysteresis film includes an $Nb_2O_5$ film.

19. The method as claimed in claim 15, wherein said first and second metal nitride films are selected from the group including MoN, TaN, WN, HfN and TiN, said patterning said first and second metal nitride films being conducted selectively against said hysteresis film while using a resist pattern.

20. The method as claimed in claim 15, wherein said patterning said first and second metal nitride films is conducted in an Ar gas by an RIE process that uses $Cl_2$ and $O_2$ as an etching gas while using a resist mask.

* * * * *

UNITED STATES PATENT AND TRADEMARK OFFICE
CERTIFICATE OF CORRECTION

| | |
|---|---|
| PATENT NO. | : 7,612,400 B2 |
| APPLICATION NO. | : 11/944847 |
| DATED | : November 3, 2009 |
| INVENTOR(S) | : Kurahashi et al. |

Page 1 of 1

It is certified that error appears in the above-identified patent and that said Letters Patent is hereby corrected as shown below:

Title Page, the Foreign Application Priority Data should be added below the Prior Publication Data and above the International Classification as shown below:

(65)    Prior Publication Data
           US 2008/0121858 A1    May 29, 2008

-- (30)    Foreign Application Priority Data
           November 29, 2006 (JP) ................................ 2006-322457 --

(51)    Int. Cl.

Signed and Sealed this
Nineteenth Day of July, 2011

David J. Kappos
*Director of the United States Patent and Trademark Office*